US005591986A

United States Patent [19]

Niigaki et al.

[11] Patent Number: 5,591,986

[45] Date of Patent: Jan. 7, 1997

[54] PHOTOEMITTER ELECTRON TUBE AND PHOTODETECTOR

[75] Inventors: Minoru Niigaki; Toru Hirohata; Tuneo Ihara; Masami Yamada, all of Hamamatsu, Japan

[73] Assignee: Hamamatsu Photonics K.K., Hamamastu, Japan

[21] Appl. No.: 299,664

[22] Filed: Sep. 2, 1994

[30] Foreign Application Priority Data

| | | | |
|---|---|---|---|
| Sep. 2, 1993 | [JP] | Japan | 5-218609 |
| Sep. 10, 1993 | [JP] | Japan | 5-226237 |

[51] Int. Cl.$^{6}$ .......... H01L 27/14; H01L 29/49; H01J 31/00

[52] U.S. Cl. .......... 257/10; 313/367; 313/501; 313/366

[58] Field of Search .......... 313/365, 379, 313/366, 367, 501; 257/10

[56] References Cited

U.S. PATENT DOCUMENTS

| | | | |
|---|---|---|---|
| 3,814,993 | 6/1974 | Kennedy et al. | 257/11 |
| 3,849,692 | 11/1974 | Beasley | 313/379 |
| 3,868,523 | 2/1975 | Klopfer | 257/10 |
| 3,993,926 | 11/1976 | Rauckhorst | 313/365 |
| 4,000,503 | 12/1976 | Matare | 257/10 |
| 4,005,465 | 1/1977 | Miller | 257/10 |
| 4,096,511 | 6/1978 | Gurnell | 257/10 |
| 4,330,797 | 5/1982 | Yokokawa | 313/365 |
| 4,871,911 | 10/1989 | Van Gorkom | 313/366 |
| 4,906,894 | 3/1990 | Miyawaki | 257/10 |

FOREIGN PATENT DOCUMENTS

| | | |
|---|---|---|
| 0259878 | 3/1988 | European Pat. Off. . |
| 0329432 | 8/1989 | European Pat. Off. . |
| 0464242 | 1/1992 | European Pat. Off. . |
| 0558308 | 9/1993 | European Pat. Off. . |
| 0592731 | 4/1994 | European Pat. Off. . |
| 4-37823 | 2/1992 | Japan . |
| 4-269419 | 9/1992 | Japan . |
| 1023257 | 3/1966 | United Kingdom . |

*Primary Examiner*—Jerome Jackson
*Attorney, Agent, or Firm*—Cushman Darby & Cushman; IP Group of Pillsbury Madison & Sutro LLP

[57] ABSTRACT

The present invention provides a photoemission device excellent in quantum efficiency of photoelectric conversion, a high-sensitive electron tube employing it, and a high-sensitive photodetecting apparatus. A photoemission device of the present invention is arranged to have a photon absorbing layer for absorbing incident photons to excite photoelectrons, an insulator layer layered on one surface of the photon absorbing layer, a lead electrode layered on the insulator layer, and a contact formed on the other surface of the photon absorbing layer to apply a predetermined polarity voltage between the lead electrode and the other surface of the photon absorbing layer, whereby the photoelectrons excited by the incident photons entering the photon absorbing layer and moving toward the one side are made to be emitted by an electric field formed between the lead electrode and the one surface by the predetermined polarity voltage.

31 Claims, 10 Drawing Sheets

PHOTOEMITTER ELECTRON TUBE AND PHOTODETECTOR

BACKGROUND OF THE INVENTION

1. Field of the Invention

The present invention relates to a photoemission (photoelectron-emitting) device having excellent quantum efficiency in photoelectric conversion (hereinafter referred to as quantum efficiency), an electron tube with a photoelectron multiplying function, such as a photomultiplier tube or an image intensifier, employing the photoemission device to achieve increased sensitivity, and a photodetecting apparatus with high sensitivity employing such an electron tube.

2. Related Background Art

Photoemission devices convert incident photons into photoelectrons and emit the photoelectrons to the outside, and, for example, are applied to light-receiving surfaces of photomultiplier tubes or image intensifiers.

Materials such as alkali antimonides are generally used in conventional photoemission devices. For example, monoalkali photoemitters such as Sb·Cs, bialkali photoemitters such as Sb·K/Cs, and multialkali photoemitters such as (Na·K·Sb)Cs are widely put to practical use. The photoemitters of such types, however, had a lower photoemission ratio (quantum efficiency for long-wavelength incident photons than that for short-wavelength incident photons, which raised a problem that high-sensitive performance could not be achieved over a wide band and a problem that even for short-wavelength incident photons the quantum efficiency was not high enough.

In order to improve the quantum efficiency for long-wavelength incident photons, negative electron affinity photoemitters using a GaAs semiconductor were developed. In the negative electron affinity photoemitters, the energy of the vacuum level is lower than the conduction band. Then, once photoelectrons at the bottom of the conduction band can move up to the emission surface, they can escape into the vacuum. This can improve the quantum efficiency for long-wavelength incident photons. Use of a single-crystal semiconductor of GaAs can extend the diffusion length of photoelectrons as compared with the photoemitters using polycrystal materials of alkali antimonides. Even if the single-crystal semiconductor is thick enough to absorb all incident photons, the diffusion length can be too long for photoelectrons to reach the emission surface.

Actual quantum efficiencies of the negative electron affinity photoemitters, however, are still about 20% for the wide band ranging from short wavelengths to long wavelengths, though an improvement is recognized for long-wavelength incident photons.

As discussed, the quantum efficiencies of the photoemitters under practical use are about 30% for short-wavelength (for example, ultraviolet) light, but normally about 10%, which is extremely low as compared with known solid state photodetectors such as photodiodes utilizing the photoconduction or photoelectromotive force. This is a significant drawback in light detection technology utilizing photoemission, because approximately 90% of all photons incident into the photoemission device are not detected.

Further, it is generally known that with negative electron affinity photoemitters the quantum efficiency can be increased by such an arrangement that the anode is located in close proximity to the emission surface of photoelectrons and a high voltage is applied between them to generate a high electric field near the emission surface. It is structurally difficult, however to form a uniformly narrow gap between the anode and the cathode (pole on the emission surface side) in order to obtain such a high electric field. If an applied voltage is increased instead of narrowing the gap, a high-voltage power supply of about 10 kV is necessary, raising a problem of electric discharge caused between the emission surface and the anode.

U.S. Pat. No. 3,958,143 discloses another example of a conventional photoemitter. In this photoemitter, a Schottky electrode is formed on one surface (photon-entering surface) of a photon absorbing layer of a semiconductor or a semiconductor hetero structure, and an ohmic contact is formed on the other surface (opposite to the photon-entering surface with respect to the photon absorbing layer). When photons enter the photon absorbing layer and a bias voltage is applied between the Schottky electrode and the ohmic contact at predetermined polarities, photoelectrons excited in the photon absorbing layer move to the Schottky electrode and are transferred to a higher energy band to be emitted into the vacuum.

The photoemitter of such structure was achieved with a Schottky electrode formed from a very thin (below 100 angstroms) Ag film. Accordingly, even existing semiconductor fabrication technology can rarely assure reproducibility and uniformity of the film thickness of the Schottky electrode, presenting great difficulties in putting this technology to practical use.

Japanese Laid-open Patent Application No. 4-269419 discloses another photoemitter which attempts to solve the problem in U.S. Pat. No. 3,958,143. In the photoemitter, a Schottky electrode is formed in a suitable pattern on one surface (photon-entering surface) of a photon absorbing layer of a semiconductor or a semiconductor hetero structure, and an ohmic contact is formed on the other surface (opposite to the photon-entering surface with respect to the photon absorbing layer). When photons enter the photon absorbing layer with a bias voltage being applied between the Schottky electrode and the ohmic contact at predetermined polarities, photoelectrons excited in the photon absorbing layer move to the Schottky electrode and are transferred to a higher energy band to be emitted into the vacuum. Thus, Japanese Laid-open Application No. 4-269419 employed a patterned Schottky electrode instead of a uniform Schottky electrode formed over the entire surface of the photon absorbing layer, thus enabling the uniformity and reproducibility to be enhanced through in the use of the lithography technology. In other words, Japanese application No. 4-269419 succeeded in improving the uniformity and reproducibility of the Schottky electrode. The photoemitter, however, had a problem that the sensitivity (quantum efficiency) for long-wavelength incident photons was lower than that for short-wavelength incident photons.

An object of the present invention is to provide a photoemission device showing high-sensitive performance over a wide wavelength range and further to provide an electron tube and a photodetecting apparatus employing such a photoemission device.

SUMMARY OF THE INVENTION

A photoemission device of the present invention is arranged to have a photon absorbing layer for absorbing incident photons to excite photoelectrons, an insulator layer layered on one surface of the photon absorbing layer, a lead electrode layered on the insulator layer, and a contact formed on the other surface of the photon absorbing layer in order to apply a predetermined polarity voltage between the lead electrode and the other surface of the photon absorbing layer, whereby the photoelectrons excited by the incident photons entering the photon absorbing layer and moving toward the one surface are made to be emitted by an electric field formed between the lead electrode and the one surface by the predetermined polarity voltage.

In the photoemission device having the above structure, the external electric field is applied between the surface of the photon absorbing layer and the lead electrode, so that the energy barrier becomes extremely narrow between the emission surface of photoelectrons and the vacuum. Accordingly, the photoelectrons excited in the photon absorbing layer can pass through the narrow energy barrier by the tunnel effect so as to readily escape into the vacuum. Further, the insulator layer can be formed to be very thin and uniform by the semiconductor fabrication technology, so that the external electric field can be uniform between the emission surface of the photon absorbing layer and the lead electrode. As a result, the applied voltage does not have to be set as high as voltages employed in conventional devices, thus overcoming the problem of destruction of photoemission device due to the electric discharge.

Since the energy barrier is narrow as described, the quantum efficiency is greatly improved, achieving a high-sensitive photoemission device. An electron tube to which such a photoemission device is applied can emit photoelectrons at a high efficiency from the photoemission device before electron multiplication, thus achieving a high signal to voice ratio. Further, applying such an electron tube to a photodetecting apparatus, the photodetecting apparatus can be provided with a very high detection limit.

Further, a photoemission device of the present invention is arranged to have a photon absorbing layer having a p-type semiconductor, a semi-insulating semiconductor, or a hetero lamination structure for absorbing incident photons to excite photoelectrons, a Schottky electrode layered on one surface of the photon absorbing layer, a lead electrode layered through an insulator layer on the Schottky electrode, and a contact provided for applying a predetermined polarity voltage between the photon absorbing layer and the Schottky electrode, whereby, applying the predetermined polarity voltage between the photon absorbing layer and the Schottky electrode and a predetermined polarity voltage between the Schottky electrode and the lead electrode, the photoelectrons are made to be emitted as the incident photons enter the photon absorbing layer. In this arrangement, a converging electrode to which a predetermined voltage is applied may be further layered through another insulator layer on the lead electrode. In the photoemission device, the Schottky electrode is layered in a predetermined pattern on the photon absorbing layer, and a metal layer of either one of alkali metals, compounds thereof, oxides thereof, and fluorides thereof is layered over regions where the insulator layer is not formed.

In the photoemission device having such a Schottky electrode, the photoelectrons excited in the photon absorbing layer can readily reach the emission surface because of an internal electric field produced by the bias voltage applied between the photon absorbing layer and the Schottky electrode. Further, the energy barrier between the emission surface of photoelectrons and the vacuum becomes very narrow because of an external electric field produced by the predetermined polarity voltage applied between the Schottky electrode and the lead electrode. Accordingly, the photoelectrons can pass through the narrow energy barrier by the tunnel effect to readily escape into the vacuum. Further, the insulator layer is formed to be very thin and uniform by using semiconductor fabrication technology, so that the external electric field can be uniform between the Schottky electrode and the lead electrode. As a result, the bias voltage does not have to be set as high as voltages employed in conventional devices, thus overcoming the problem of destruction of photoemission device due to the electric discharge.

An electron tube in which a photoemission device having a Schottky electrode is applied can emit photoelectrons at a high efficiency from the photoemission device before electron multiplication, thus achieving a high signal to noise ratio. Further, applying such an electron tube to a photodetecting apparatus, the photodetecting apparatus can be provided with a very high detection limit.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Embodiment 1

Figure 1:
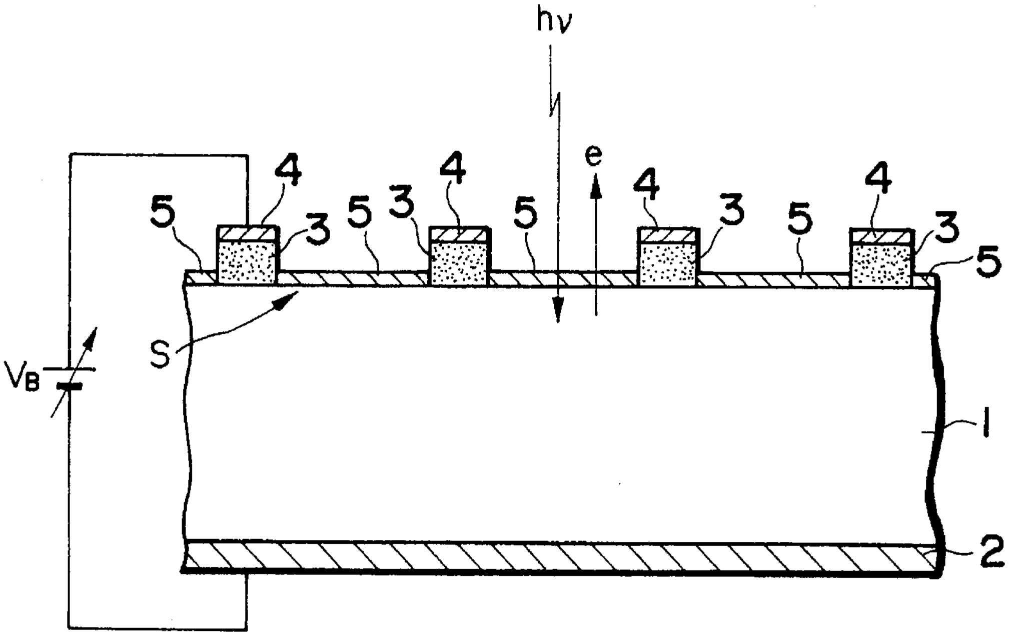
FIG. 1 is a vertical cross section to show the structure of the first embodiment (reflection-type photoemission device) according to the present invention.

The first embodiment of the photoemission device according to the present invention will be described referring to FIG. 1 to FIG. 3. This embodiment concerns a reflection-type photoemission device. The structure of the photoemission device is first described based on the vertical cross section shown in FIG. 1. An ohmic contact 2 is formed by vapor deposition of AuGe over the entire back surface of a photon absorbing layer 1 made of a p-type semiconductor. In this embodiment the photon absorbing layer 1 is of GaAs with carrier density of $1\times10^{19}(cm^{-3})$. An insulator layer 3 of $SiO_2$ or $Si_3N_4$ is layered in a predetermined pattern over the top surface of the photon absorbing layer 1. Further, a lead electrode 4 of Al is layered over the top surface of the insulator layer 3. Among the top surface of the photon absorbing layer 1 regions without the insulator layer 3 are coated with a metal layer 5 of $Cs_2O$ to enhance the photoemission. Such a reflection-type photoemission device is operated in a vacuum atmosphere (or in a vacuum tube) while an arbitrary voltage $V_B$ is applied between the lead electrode 4 and the ohmic contact 2. The applied voltage $V_B$ keeps the lead electrode 4 at a higher potential than the ohmic contact 2.

The operation of the reflection-type photoemission device having the above structure is next described with reference to the energy band diagrams shown in FIG. 2 and FIG. 3. In the drawings, CB represents the level of the conduction band, VB the level of the valence band, Fl the Fermi level, and VL the vacuum level.

Figure 3:
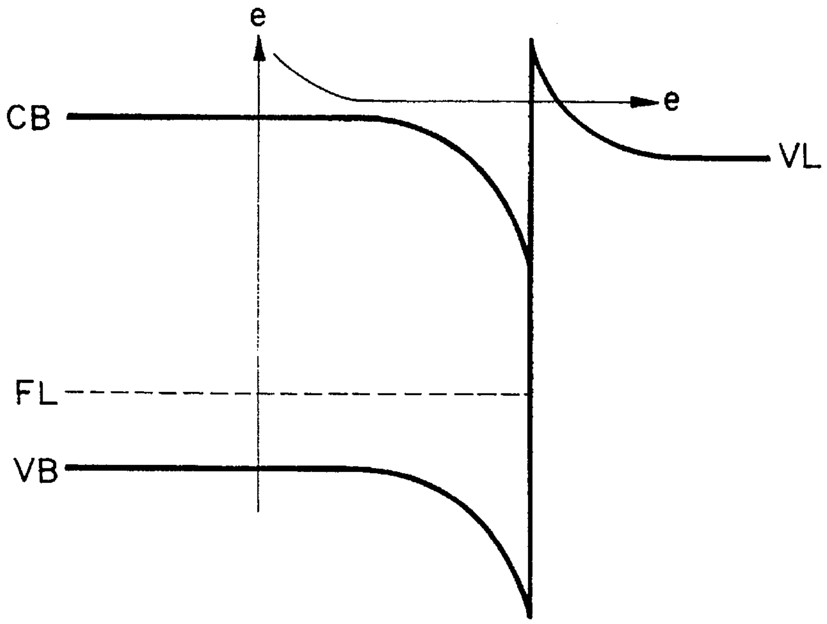
FIG. 3 is an energy band diagram to further illustrate the function of the photoemission device shown in FIG. 1.

FIG. 3 shows energy band structure in a case where the voltage $V_B$ is not applied, that is, where the circuit is open between the ohmic contact 2 and the lead electrode 4. When incident photons hν enter the photon absorbing layer 1 from the top surface side, photoelectrons e excited to the conduction band CB of the photon absorbing layer 1 move from the bottom of the conduction band CB up to the emission surface. Among the photoelectrons e having moved to (or reached) the emission surface, only those overcoming the energy barrier between the level of the conduction band CB of the surface of the photon absorbing layer 1 and the vacuum level VL can escape into the vacuum. An escape probability of photoelectrons e into the vacuum is about 20%.

Figure 2:
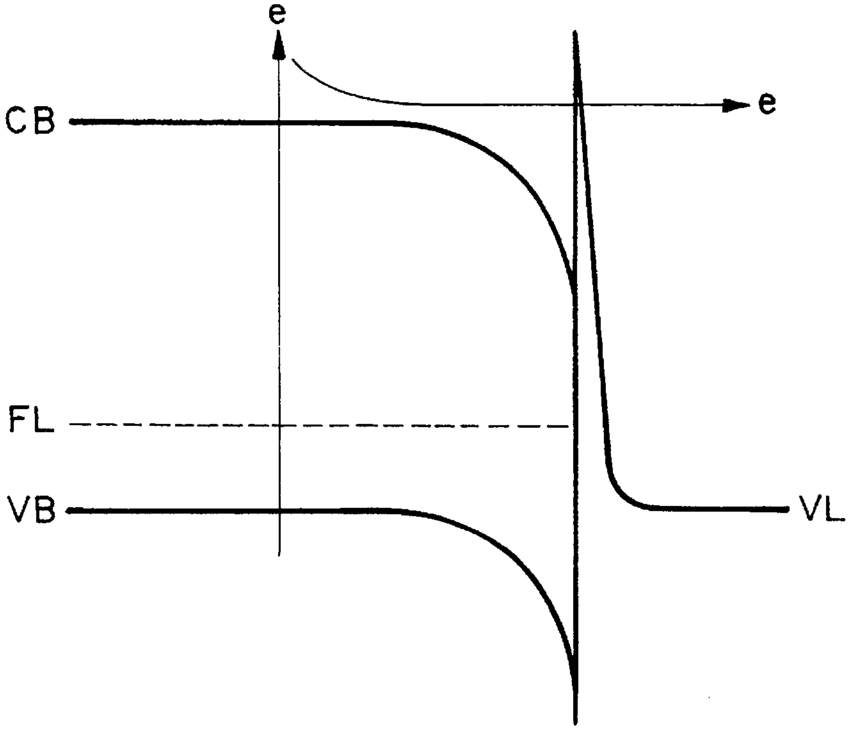
FIG. 2 is an energy band diagram to illustrate a function of the photoemission device shown in FIG. 1.

When the voltage $V_B$ is applied between the ohmic contact 2 and the lead electrode 4, the energy band structure turns into one as shown in FIG. 2. On this occasion the photoelectrons e excited to the conduction band CB of the photon absorbing layer by the incident photons hν move from the bottom of the conduction band CB to the emission surface.

Here, a feature of the present invention to be noted is that the application of the voltage $V_B$ forms an external field between the surface S of the photon absorbing layer 1 and the lead electrode 4 whereby, as shown in FIG. 2, the vacuum level VL becomes considerably lower than the level of conduction band CB and the energy barrier becomes very narrow between the emission surface and the vacuum. Accordingly, the photoelectrons e can pass through the narrow energy barrier by the tunnel effect to readily escape into the vacuum.

Further, the insulator layer 3 is formed so as to be very thin and uniform using semiconductor fabrication technology, which makes the external field uniform between the surface S of the photon absorbing layer 1 and the lead electrode 4. As a result, the voltage $V_B$ does not have to be set as high as the high voltages employed in conventional photoemitters, thus overcoming the problem of the destruction of photoemitter due to electric discharge.

As described, the present embodiment is effective to narrow the energy barrier, so that the quantum efficiency can be greatly improved, thus achieving high-sensitive photoemission device.

Although the present embodiment employed the photon absorbing layer 1 of the GaAs semiconductor, the present invention is by no means limited to it. The invention may employ another photon absorbing layer of a different type with the same effect. The present embodiment was so arranged that the ohmic contact 2 was of the alloy (AuGe) of gold and germanium and the lead electrode 4 was of aluminum (Al), but they are not limited to them. They may be made of other metals. Further, the metal layer 5 over the surface of the photon absorbing layer 1 does not have to be limited to $Cs_2O$, but may be formed of a material selected from other alkali metals, compounds thereof, oxides thereof, and fluorides thereof.

Embodiment 2

The second embodiment of the photoemission device according to the present invention will be described referring to FIG. 4. This embodiment relates to a transmission-type photoemission device. The structure of the device is first described referring to the vertical cross section shown in FIG. 4. An anti-reflection film 7 of $SiO_2$ film **7*a* and $Si_3N_4$ film 7*b* is layered over a transparent glass substrate 6. Further, a window layer 8 of AlGaAs and a photon absorbing layer 9 of a p-type semiconductor of GaAs are successively layered over the anti-reflection film 7. An insulator layer 10 of $SiO_2$ or $Si_3N_4$ is formed in a predetermined pattern on the surface of the photon absorbing layer 9, and a lead electrode 11 of Al is formed on the top surface of the insulator layer 10. Among the surface of the photon absorbing layer 9, regions on which the insulator layer 10 is not layered are coated with a metal layer 12 of $Cs_2O$ to enhance the photoemission. Further, a cathode electrode 13 is formed by vapor deposition of Cr so as to cover the edge portion of transparent glass substrate 6, the side ends of anti-reflection film 7, window layer 8, and photon absorbing layer 9, and a part of the surface of the photon absorbing layer 9**.

Such a transmission-type photoemission device is operated in a vacuum atmosphere (or in a vacuum tube) while an arbitrary voltage $V_B$ is applied between the lead electrode 11 and the cathode electrode 13. The applied voltage $V_B$ keeps the lead electrode 11 higher in potential than the cathode electrode 13.

The operation of the transmission-type photoemission device having the above structure is next described.

When photons hν enter the device from the transparent glass substrate 6 side with application of the arbitrary voltage $V_B$, the photons hν pass through the anti-reflection film 7 and the window layer 8, and then are absorbed in the photon absorbing layer 9. With the absorption, photoelectrons e are excited in the photon absorbing layer 9 and are diffused up to the emission surface S. Since the voltage $V_B$ causes an electric field to be formed between the cathode electrode 13 and the emission surface S of the photon absorbing layer 9, the photoelectrons e pass through a narrow energy barrier, similarly as in the energy band structure shown in FIG. 2, to readily escape into the vacuum.

As described, the transmission-type photoemission device of the present embodiment can also greatly improve the quantum efficiency, similarly as the above reflection-type photoemission device, so as to realize a high-sensitive photoemission device. Since the insulator layer 10 is formed as to be very thin and uniform using semiconductor fabrication technology, the external field can be uniform between the surface S of the photon absorbing layer 9 and the lead electrode 11. As a result, the voltage $V_B$ does not have to be set as high as the high voltages employed in conventional devices, thus overcoming the problem of destruction of photoemission device due to electric discharge.

Although this embodiment employed a GaAs semiconductor as the photon absorbing layer 9, the present invention is not limited to it. A photon absorbing layer of another material may be employed with the same effect. Also, the lead electrode 11 and the cathode electrode 13 may be formed of other metal materials. Further, the metal layer 12 over the surface of the photon absorbing layer 9 does not have to be limited to $Cs_2O$, but may be made of a material selected from other alkali metals, compounds thereof, oxides thereof, and fluorides thereof.

Figure 4:
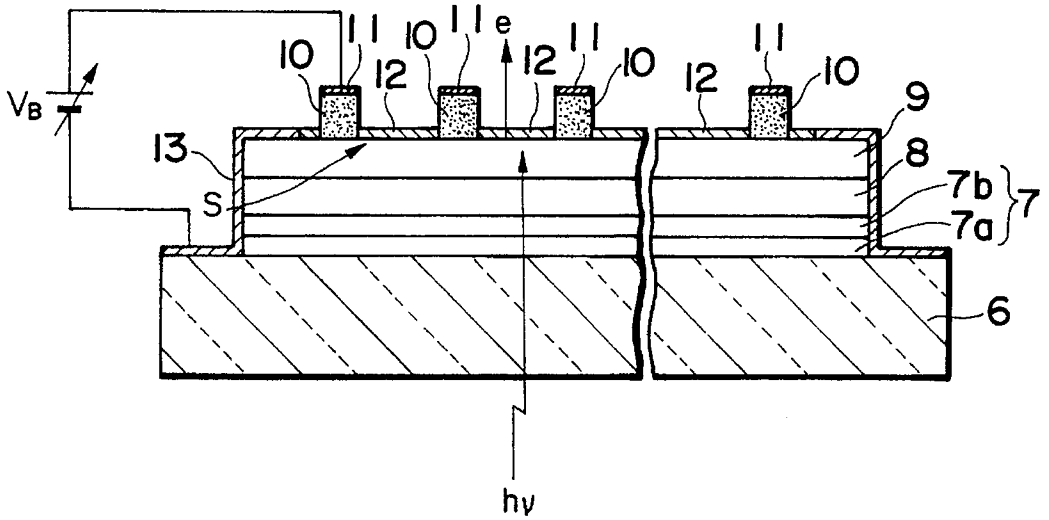
FIG. 4 is a vertical cross section to show the structure of the second embodiment (transmission-type photoemission device)

In the photoemission devices constructed as shown in FIG. 1 and FIG. 4, the following modifications are possible.

(1) The photon absorbing layer 1, 9 is formed of a III–V compound semiconductor or a mixed crystal thereof, or a hetero structure of III–V compound semiconductors.

(2) The photon absorbing layer 1, 9 is formed of GaAs.

(3) The photon absorbing layer 1, 9 is formed of $GaAs_yP_{(1-y)}$ (where $0 \leqq y1$).

(4) The photon absorbing layer 1, 9 is formed of $In_xGa_{(1-x)}As_yP_{(1-y)}$ (where $0 \leqq x \leqq 1$ and $0 \leqq y \leqq 1$).

(5) The photon absorbing layer 1, 9 is formed of a hetero structure of GaAs and $Al_xGa_{(1-x)}As$ (where $0 \leqq x \leqq 1$).

(6) The photon absorbing layer 1, 9 is formed of a hetero structure of GaAs and $In_xGa_{(1-x)}As$ (where $0 \leqq x \leqq 1$).

(7) The photon absorbing layer 1, 9 is formed of a hetero structure of InP and $In_xGa_{(1-x)}As_yP_{(1-y)}$ (where $0 \leqq x \leqq 1$ and $0 \leqq y \leqq 1$).

(8) The photon absorbing layer 1, 9 is formed of a hetero structure of InP and $In_xAl_yGa_{[1-(x+y)]}As$ (where $0 \leqq x \leqq 1$ and $0 \leqq y \leqq 1$).

(9) The photon absorbing layer 1, 9 is formed of p-type Si or p-type Ge, or a mixed crystal thereof, or a hetero structure thereof.

(10) The photon absorbing layer 1, 9 is arranged to have a carrier density in the range of about $1 \times 10^{18}$ to about $5 \times 10^{19}$ ($cm^{-3}$).

(11) The insulator layer 3, 10 is $SiO_2$ or $Si_3N_4$, or $Al_2O_3$, or a lamination thereof.

(12) The metal layer 5, 12 is formed of Cs, K, Na, or Rb.

Embodiment 3

The third embodiment of the photoemission device according to the present invention will now be described referring to FIG. 5 to FIG. 8. The present embodiment relates to a reflection-type photoemission device. The structure of the device is described based on the vertical cross section shown in FIG. 5. A $p^-$ photon absorbing layer 22 and a $p^-$ contact layer 23 are epitaxially grown on a $p^+$ semiconductor substrate 21, while an ohmic contact 24 is formed over the back surface of the semiconductor substrate 21. Further, a Schottky electrode 25 is layered in a proper pattern on the top surface of the $p^{31}$ layer 23, and a lead electrode 27 is layered through an insulator layer 26 on the Schottky electrode 25. Accordingly, the insulator layer 26 and lead electrode 27 are formed in the predetermined pattern corresponding to the Schottky electrode 25. Regions of the surface of $p^{31}$ layer 23 where the Schottky electrode 25 is not formed are coated with a very thin metal film 28 of an alkali metal, so as to improve the emission efficiency of photoelectrons excited in the $p^{31}$ photon absorbing layer 22 and reaching the surface of $p^{31}$ layer 23 (hereinafter referred to as an emission surface) therethrough.

A bias voltage $V_{BS}$ is applied between the Schottky electrode 25 and the ohmic contact 24 so as to keep the Schottky electrode 25 at higher potential than the ohmic contact, and a bias voltage $V_{BO}$ is applied between the lead electrode 27 and the Schottky electrode 25 so as to keep the lead electrode 27 at higher potential than the Schottky electrode.

The operation of the photoemission device having the above structure is next described.

Figure 6:
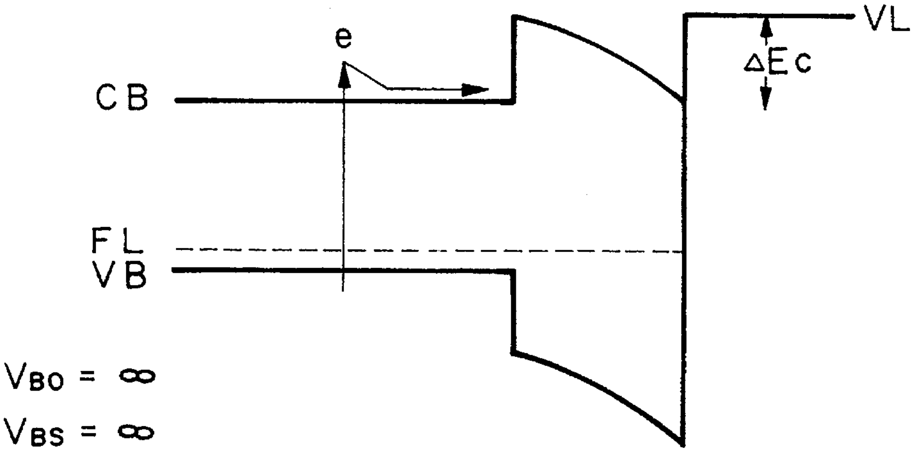
FIG. 6 is an energy band diagram to illustrate a function of the photoemission device shown in FIG. 5.

First described referring to FIG. 6 is the operation when photons impinge on the device without application of the bias voltages $V_{BS}$ and $V_{BO}$, i.e., with the ohmic contact 24, the Schottky electrode 25, and the lead electrode 27 being kept electrically open. FIG. 6 is an energy band diagram near the emission surface, in which CB is the level of the conduction band, VB the level of the valence band, FL the Fermi level, and VL the vacuum level. When photons hν impinge on the device, the incident photons hν are absorbed in the photon absorbing layer 22 to excite photoelectrons e, which move near the emission surface. As long as neither the bias voltage $V_{BS}$ nor $V_{BO}$ is applied, an energy difference $\Delta Ec$ of the conduction band CB keeps the photoelectrons e from reaching the emission surface. Therefore, the photoelectrons cannot escape into the vacuum.

Figure 7:
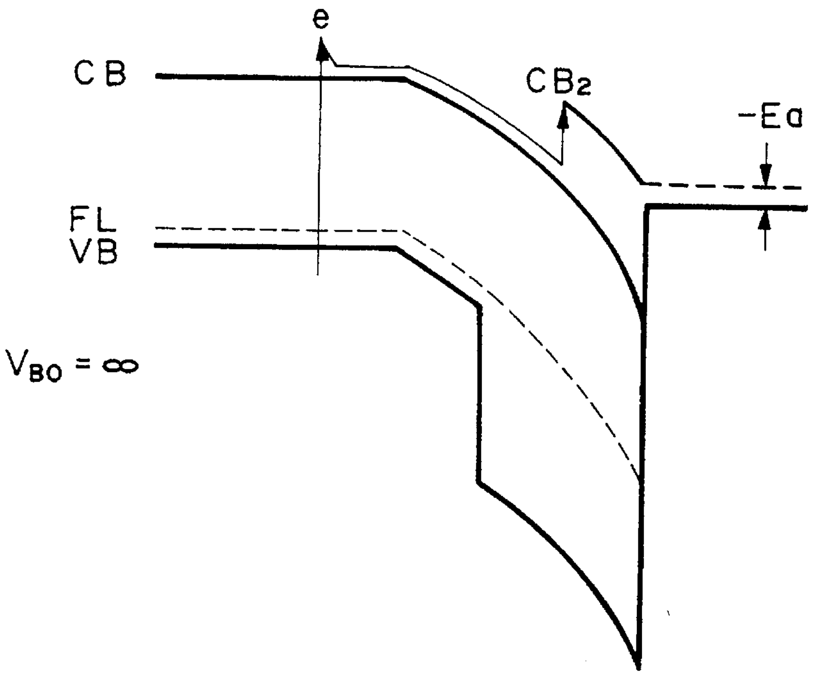
FIG. 7 is an energy band diagram to further illustrate the function of the photoemission device shown in FIG. 5.

Next described based on the energy band diagram near the emission surface shown in FIG. 7 is the operation when photons impinge on the device with application of the predetermined bias voltage $V_{BS}$ between the ohmic contact 24 and the Schottky electrode 25 but with the Schottky electrode 25 and the lead electrode 27 being kept electrically open. In FIG. 7, CB is the level of the conduction band, VB the level of the valence band, FL the Fermi level, and VL the vacuum level. When photons hν impinge on the device, the incident photons hν are absorbed in the photon absorbing layer 22 to excite photoelectrons e. Further, the photoelectrons e are accelerated by an internal electric field produced by the bias voltage $V_{BS}$ to be transferred to a higher energy band $CB_2$ and then reach the surface of the photoemission device.

Unless an energy difference (i.e., electron affinity) Ea between the bottom of the transferred conduction band $CB_2$ and the vacuum level VL is negative and large enough, the escape probability of the photoelectrons e into the vacuum cannot become high enough for the photoelectrons e to escape into the vacuum. The bias setting conditions in this case cannot fully increase the efficiency of the photoelectrons e escaping into the vacuum for the incident photons (referred to as quantum efficiency). In particular, the quantum efficiency is lowered for long-wavelength incident photons hv.

Figure 8:
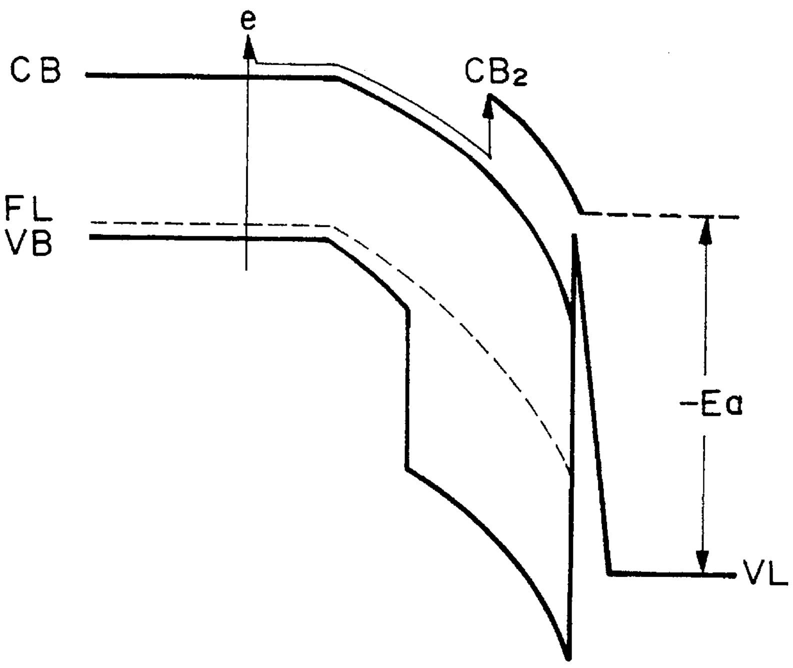
FIG. 8 is an energy band diagram to further illustrate the function of the photoemission device shown in FIG. 5.

Next described based on the energy band diagram near the emission surface shown in FIG. 8 is the operation when photons impinge on the device with application of the predetermined bias voltage $V_{BS}$ between the ohmic contact 24 and the Schottky electrode 25 and with simultaneous application of the predetermined bias voltage $V_{BO}$ between the Schottky electrode 25 and the lead electrode 27. In FIG. 8, CV is the level of the conduction band, VB the level of the valence band, FL the Fermi level, and VL the vacuum level. When photons hv impinge on the device, the incident photons hv are absorbed in the photon absorbing layer 22 to excite photoelectrons e. Further, the photoelectrons e are accelerated by the internal field produced by the bias voltage $V_{BS}$ to be transferred to the higher energy band $CB_2$ and to reach the surface of the photoemission device.

Further, the application of the bias voltage $V_{BO}$ forms an external field between the Schottky electrode 5 and the lead electrode 7, whereby, as shown in FIG. 8, the vacuum level VL becomes far lower than the level of the conduction band $CB_2$ and the energy barrier becomes very narrow between the emission surface and the vacuum. Accordingly, the photoelectrons e in the photoemission device can pass through the narrow energy barrier by the tunnel effect to readily escape into the vacuum. Even using a semiconductor with small energy gap, the application of the bias voltages $V_{BS}$ and $V_{BO}$ can improve the quantum efficiency, particularly the efficiency for long-wavelength incident photons hv, thus presenting high quantum efficiencies over a wide wavelength range.

Figure 5:
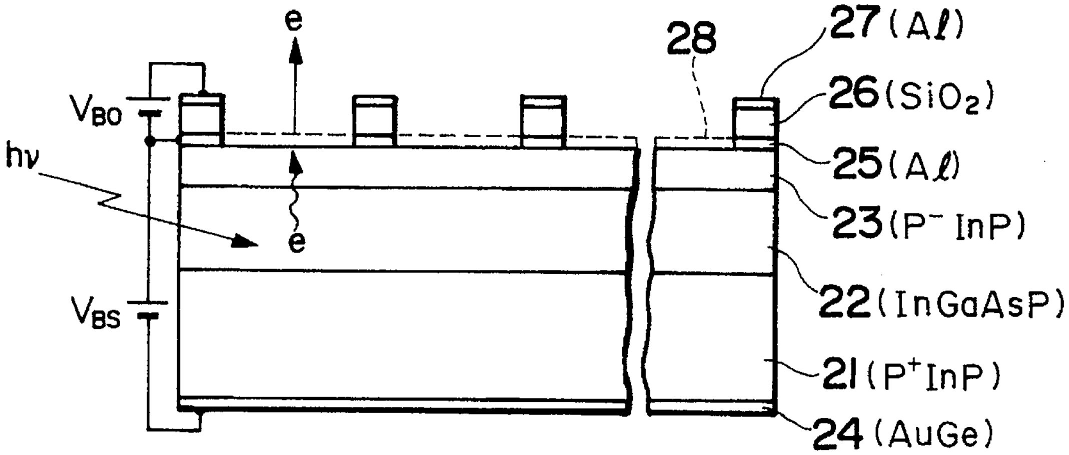
FIG. 5 is a vertical cross section to show the structure of the third embodiment (reflection-type photoemission device)

Next described is a method for fabricating the photoemission device shown in FIG. 5. In the present embodiment, the semiconductor substrate 21 is $p^+$-InP, the photon absorbing layer 22 InGaAsP, the contact layer 23 $p^-$-InP, the ohmic contact 24 AuGe, the Schottky electrode 25 Al, the insulator layer 26 $SiO_2$, and the lead electrode 27 Al.

First, the photon absorbing layer 22 and contact layer 23 are epitaxially grown in the thickness of 2 μm and in the thickness of 1 μm, respectively, on the semiconductor substrate 21. The ohmic contact 24 is formed on the back surface of semiconductor substrate 21 by vacuum evaporation. Further, the Schottky electrode 25 is vapor-evaporated in the thickness of about 1000 angstroms on the contact layer 23 and thereafter the insulator layer 26 is deposited in the thickness of about 1 μm thereon. Further, the lead electrode 27 is vapor-evaporated in the thickness of about 1000 angstroms.

Then a uniform coating of photoresist is provided for photolithography and exposure is effected thereon in a predetermined pattern using a photomask. Then the photoresist on unnecessary portions is removed. Etching portions other than the resist-masked portions with hydrofluoric acid, the etching automatically stops at the InP contact layer 23. The remaining resist is finally removed. The structure of the photoemission device shown in FIG. 5 can be thus attained by very simple steps. The resultant is subjected to heating in the vacuum to clean the surface. Then the surface is activated by Cs and $O_2$ to form the thin metal layer 28.

The metal layer 28 is not limited to $Cs_2O$, but may be formed of a material selected from other alkali metals, compounds thereof, oxides thereof, and fluorides thereof.

In the photoemission device constructed as shown in FIG. 5, the following modifications are possible.

(1) The photon absorbing layer 22 is formed of a III–V compound semiconductor or a mixed crystal thereof, or a hetero structure of III–V compound semiconductors.

(2) The photon absorbing layer 22 is formed of GaAs.

(3) The photon absorbing layer 22 is formed of $GaAs_yP_{(1-y)}$ (where $0 \leqq y \leqq 1$).

(4) The photon absorbing layer 22 is formed of $In_xGa_{(1-x)}As_yP_{(1-y)}$ (where $0 \leqq x \leqq 1$ and $0 \leqq y \leqq 1$).

(5) The photon absorbing layer 22 is formed of a hetero lamination structure of GaAs and $Al_xGa_{(1-x)}As$ (where $0 \leqq x \leqq 1$).

(6) The photon absorbing layer 22 is formed of a hetero lamination structure of GaAs and $In_xGa_{(1-x)}As$ (where $0 \leqq x \leqq 1$).

(7) The photon absorbing layer 22 is formed of a hetero lamination structure of InP and $In_xGa_{(1-x)}As_yP_{(1-y)}$ (where $0 \leqq x \leqq 1$ and $0 \leqq y \leqq 1$).

(8) The photon absorbing layer 22 is formed of a hetero lamination structure of InP and $In_xAl_yGa_{[1-(x+y)]}As$ (where $0 \leqq x \leqq 1$ and $0 \leqq y \leqq 1$).

(9) The photon absorbing layer 22 is formed of p-type Si or p-type Ge, or a mixed crystal thereof, or a hetero lamination structure thereof.

(10) The insulator layer 26 is $SiO_2$ or $Si_3N_4$, or $Al_2O_3$, or a lamination thereof.

(11) The metal layer 28 is formed of Cs, K, Na, or Rb.

Embodiment 4

Figure 9:
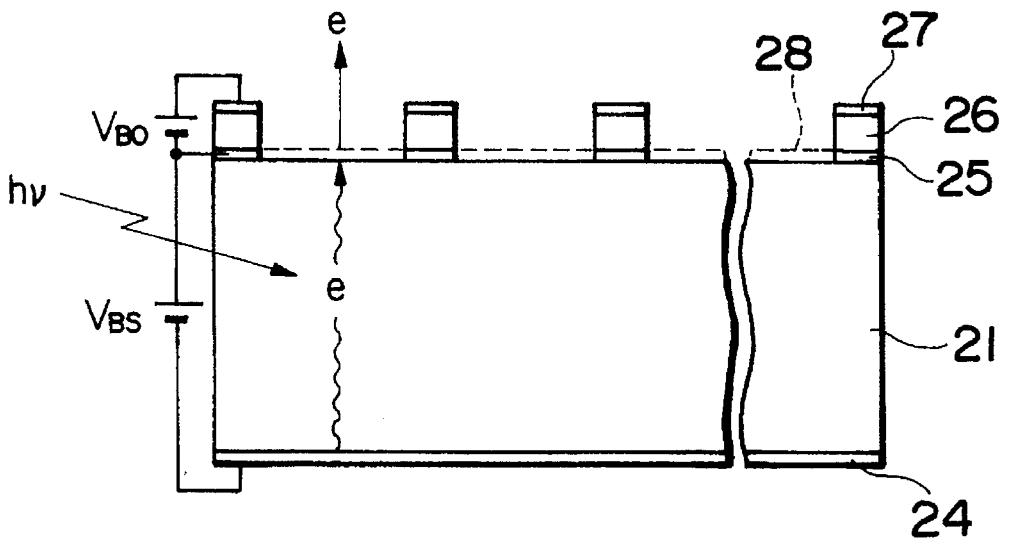
FIG. 9 is a vertical cross section to show the structure of the fourth embodiment (reflection-type photoemission device)

The fourth embodiment of the photoemission device is next described referring to FIG. 9. In FIG. 9, identical or corresponding portions to those in FIG. 9 are denoted by the same reference numerals. In this embodiment, a semi-insulating, high-resistive GaAs is applied to a semiconductor substrate 21 (functioning as an photon absorbing layer in this case). Formed on the semiconductor substrate 21 are an ohmic contact 24 of AuGe, a Schottky electrode 25 of Al, an insulator layer 26 of $SiO_2$, and a lead electrode 27 of Al. Further, regions of the surface of semiconductor substrate 21 on which the Schottky electrode 25 is not formed are coated with a thin metal layer 28 of $Cs_2O$. The photoemission device is produced by the same production method as that in the embodiment of FIG. 5.

When photons hv are incident into the device while simultaneously applying a predetermined bias voltage $V_{BS}$ between the ohmic contact 24 and the Schottky electrode 25 and a predetermined polarity bias voltage $V_{BO}$ between the Schottky electrode 25 and the lead electrode 27, the incident photons hv are absorbed in the semiconductor substrate 21 to excite photoelectrons e. Further, the photoelectrons e are accelerated by an inner electric field produced by the bias voltage $V_{BS}$ to be transferred to a higher energy band $CB_2$. The photoelectrons e reaching the photoemission surface are made to be emitted into the vacuum by an external field produced by the bias voltage $VB_{BO}$.

Thus, the present embodiment is so arranged that the semi-insulating, high-resistive GaAs is applied to the semiconductor substrate 21 so as to function as a photon absorbing layer, whereby it can show enhanced quantum efficiencies over a wide wavelength range.

Although the present embodiment employed the semiconductor substrate 21 applying the semi-insulating GaAs thereto, the substrate is not limited to it. The substrate may be any other semi-insulating semiconductor.

Embodiment 5

Figure 10:
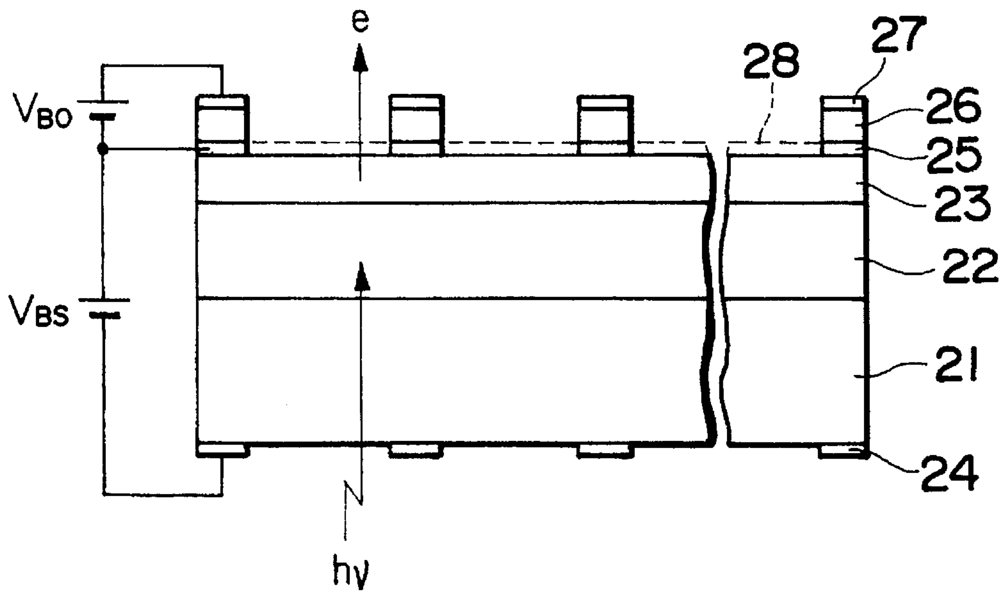
FIG. 10 is a vertical cross section to show the structure of the fifth embodiment (transmission-type photoemission device)

The fifth embodiment of the photoemission device is next described referring to FIG. 10. In FIG. 10, identical or corresponding portions to those in FIG. 5 are denoted by the same reference numerals.

The photoemission device shown in FIG. 5 is of the reflection type in which photoelectrons are outgoing from the same surface as incident photons enter, while the present embodiment shown in FIG. 10 is a transmission-type photoemission device in which photons hν are incident from the back surface side of a semiconductor substrate 21 and photoelectrons e are outgoing from the side of a metal layer 28. In more detail, an ohmic contact 24 is formed in a predetermined pattern on the back surface side of the semiconductor substrate 21 and the photons hν enter portions of the back surface where the ohmic contact 24 is not formed.

When the photons hν impinge on the device with application of a predetermined bias voltage $V_{BS}$ between the ohmic contact 24 and the Schottky electrode 25 and a predetermined bias voltage $V_{BO}$ between the Schottky electrode 25 and the lead electrode 27, the incident photons hν are absorbed in the photon absorbing layer 22 to excite photoelectrons e. Further, the photoelectrons e are accelerated by an internal field produced by the bias voltage $V_{BS}$ to be transferred to a higher energy band $CB_2$. Then the photoelectrons e reaching the photoemission surface are made to be emitted into the vacuum by an external field produced by the bias voltage $V_{BO}$.

Thus, the present embodiment can also show high quantum efficiencies over a wide wavelength range.

Embodiment 6

Figure 11:
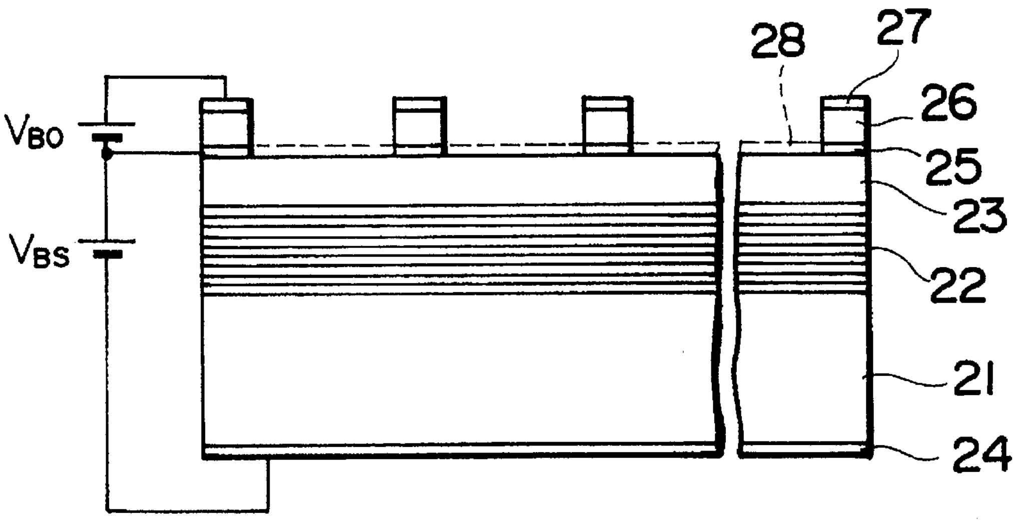
FIG. 11 is a vertical cross section to show the structure of the sixth embodiment (reflection-type photoemission device)

The sixth embodiment of the photoemission surface is described referring to FIG. 11. The present embodiment is different from the embodiment shown in FIG. 5 in that the photon absorbing layer 22 has a so-called quantum well structure formed of a multi-layered semiconductor films so as to utilize photon absorption between sub-bands in the quantum well. The photoemission device utilizing the photon absorption between sub-bands in the quantum well itself is already disclosed in Japanese Laid-open Patent Application No. 4-37823. The present embodiment of FIG. 11 is, however, arranged such that a lead electrode 27 is further formed through an insulator layer 26 on the photoemission device to enhance the emission probability of photoelectrons e by an external field produced by the bias voltage $V_{BO}$, thus showing high quantum efficiencies over a wide wavelength range.

Embodiment 7

Figure 12:
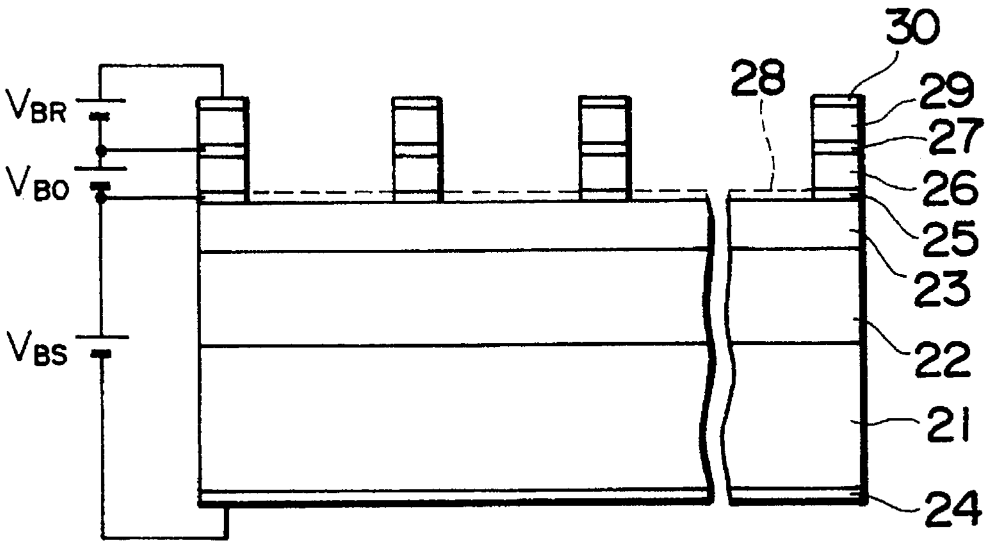
FIG. 12 is a vertical cross section to show the structure of the seventh embodiment (reflection-type photoemission device)

The seventh embodiment of the photoemission device is next described referring to FIG. 12. In FIG. 12, identical or corresponding portions to those in FIG. 5 are denoted by the same reference numerals. The present embodiment is substantially the same as the embodiment shown in FIG. 5 except that an insulator layer 29 of $SiO_2$ and a converging electrode 30 of Al are further laminated in order in a predetermined pattern on a lead electrode 27. A predetermined bias voltage $V_{BR}$ is applied between the lead electrode 27 and the converging electrode 30 as to keep the converging electrode 30 at a higher potential than the lead electrode.

This arrangement enables the bias voltage $V_{BR}$ applied to the converging electrode 30 to control a spread of photoelectrons e emitted from the photoemission device into the vacuum, whereby orbits of photoelectrons e can be controlled. With the addition of such a function, the photoemission device can greatly improve the resolution, for example, when it is applied to an image tube or the like.

Embodiment 8

Figure 13:
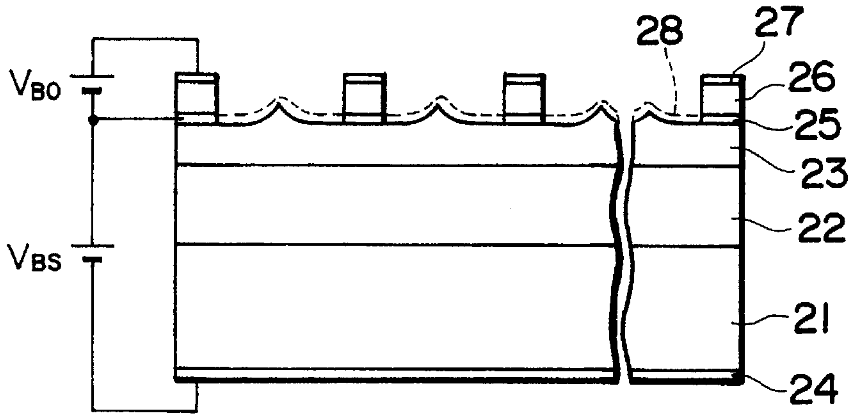
FIG. 13 is a vertical cross section to show the structure of the eighth embodiment (reflection-type photoemission device)

The eighth embodiment of the photoemission device is described referring to FIG. 13. In FIG. 13, identical or corresponding portions to those in FIG. 5 are denoted by the same reference numerals. The present embodiment is substantially the same as the embodiment shown in FIG. 5 except that the emission surface of photoelectrons e has microscopic asperities. Such microscopic asperities can be formed by known etching technology.

The microscopic asperities on the emission surface of photoelectrons e can facilitate emission of the photoelectrons e reaching the emission surface into the vacuum, so that the device can show high quantum efficiencies over a further wider wavelength range.

The third to eighth embodiments were illustrated based on the respective structural features, but it should be noted that the present invention includes all photoemission devices achieved by combining the features. Further, these embodiments showed the ohmic contact 24 formed on the back side of $p^+$-semiconductor substrate 21, but the present invention is by no means limited to this structure. For example, the ohmic contact may be selectively formed on the side surface or on the top surface of $p^+$-type semiconductor substrate 21.

Embodiment 9

Figure 14:
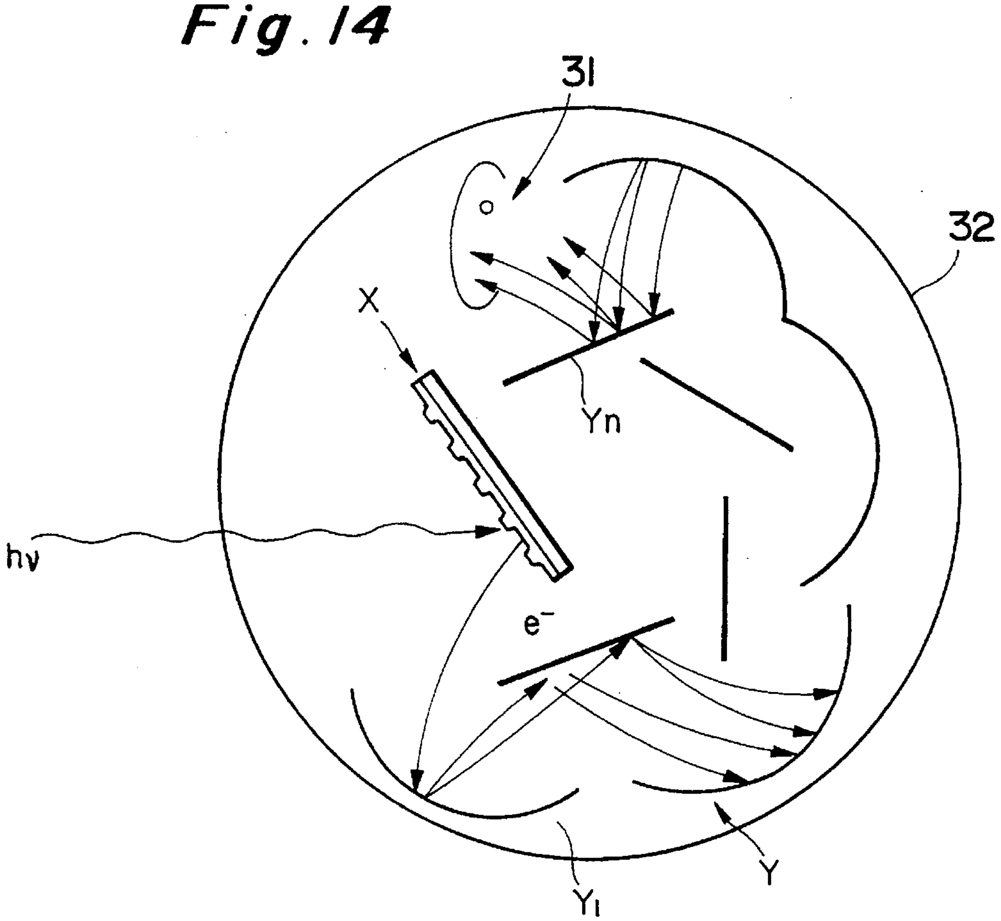
FIG. 14 is a cross section to show the structure of main part of an embodiment of a photomultiplier tube according to the present invention.

The following description, with reference to FIG. 14 is an embodiment of a photomultiplier tube to which the photoemission device according to the present invention is applied. This embodiment is a side-on reflection-type photomultiplier tube to which any one of the reflection-type photoemission devices shown in FIG. 1, FIG. 5, FIG. 11, FIG. 12, and FIG. 13 is applied. FIG. 14 is a cross section of main part of the photomultiplier tube.

First, the structure is described. A reflection-type photoemission device X and dynodes Y are hermetically sealed in a vacuum vessel. An acceleration voltage of about 100 volts is applied between the lead electrode of the reflection-type photoemission device X and a first dynode $Y_1$ so as to keep the dynode $Y_1$ at higher potential. An anode 31 is arranged to internally face a final (n-th) dynode $Y_n$.

Next described is the operation of the photomultiplier tube having the above structure. When photons hν enter the reflection-type photoemission device X through a photon-entering window 32, the photons hν are absorbed in the photoemission device X to excite photoelectrons e, which are emitted into the vacuum. The acceleration voltage of about 100 volts accelerates the photoelectrons toward the first dynode $Y_1$. As previously described, the photoemission device X has a high quantum efficiency to emit the photoelectrons e into the vacuum.

When the accelerated photoelectrons e enter the first dynode $Y_1$, the first dynode $Y_1$ emits secondary electrons about two to three times more than the incident electrons. The secondary electrons are then incident into a second dynode. The secondary emission is repeated by a plurality of dynodes up to the n-th dynode $Y_n$, whereby the photoelectrons e are amplified about $10^6$ times and the thus amplified photocurrents are detected from the anode 31.

The photomultiplier tube of the present embodiment is so arranged, as described above, that the photoemission device X with high quantum efficiency emits a lot of photoelectrons e from the beginning and the dynodes multiply the number of electrons, enabling to attain a high signal to noise ratio and high gain.

Embodiment 10

Figure 15:
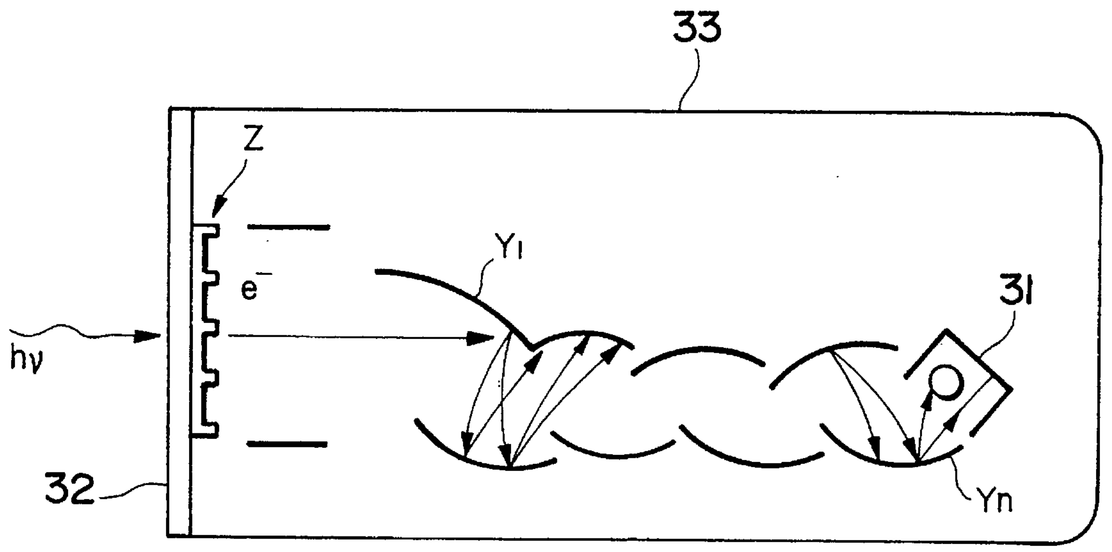
FIG. 15 is a cross section to show the structure of main part of another embodiment of a photomultiplier tube according to the present invention.

A transmission-type photomultiplier tube to which the photoemission device according to the present invention is applied will now be described with reference to FIG. 15. The present embodiment is a head-on transmission-type photomultiplier tube to which either one of the transmission-type photoemission devices shown in FIG. 4 and FIG. 10 is applied. FIG. 15 is a cross section of main part of the photomultiplier tube, in which identical or corresponding portions to those in FIG. 14 are denoted by the same reference numerals.

A transmission-type photoemission device Z is fixed to the inner surface of photon-entering window 32 provided at one end of a vacuum vessel 33. There are a plurality of dynodes $Y_1$ to $Y_n$ and an anode 31 arranged behind the transmission-type photoemission device Z. A voltage of some hundred volts is applied to the photoemission device.

When photons hν impinge on the photoemission device Z through the photon-entering window 32, the photons hν are absorbed in the photoemission device Z to excite photoelectrons e, which are emitted into the vacuum. Further, the photoelectrons are accelerated by the acceleration voltage due to the applied voltage of some hundred volts toward the first dynode $Y_1$. As described previously, the photoemission device Z has a high quantum efficiency to emit the photoelectrons e into the vacuum. When the accelerated photoelectrons e enter the first dynode $Y_1$, the first dynode emits secondary electrons about two to three times more than the incident photoelectrons. Further, the secondary electrons are incident into the second dynode. Since the secondary emission is repeated by a plurality of dynodes up to the n-th dynode $Y_n$, the photoelectrons e are multiplied about $10^6$ times to be detected as photocurrents from the anode 31.

The transmission-type photomultiplier tube of the present embodiment is so arranged, as described above, that the photoemission device Z with high quantum efficiency emits a lot of photoelectrons e from the beginning and the dynodes multiply the electrons, thus enabling to attain high S/N and high gain.

Embodiment 11

Figure 16:
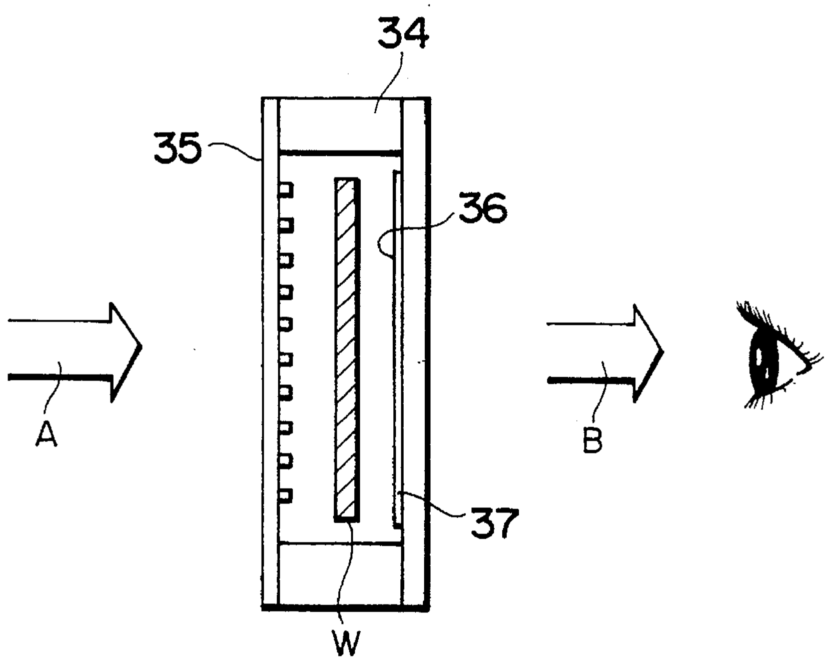
FIG. 16 is a cross section to show the structure of main part of an embodiment of an image intensifier according to the present invention.
Figure 18:
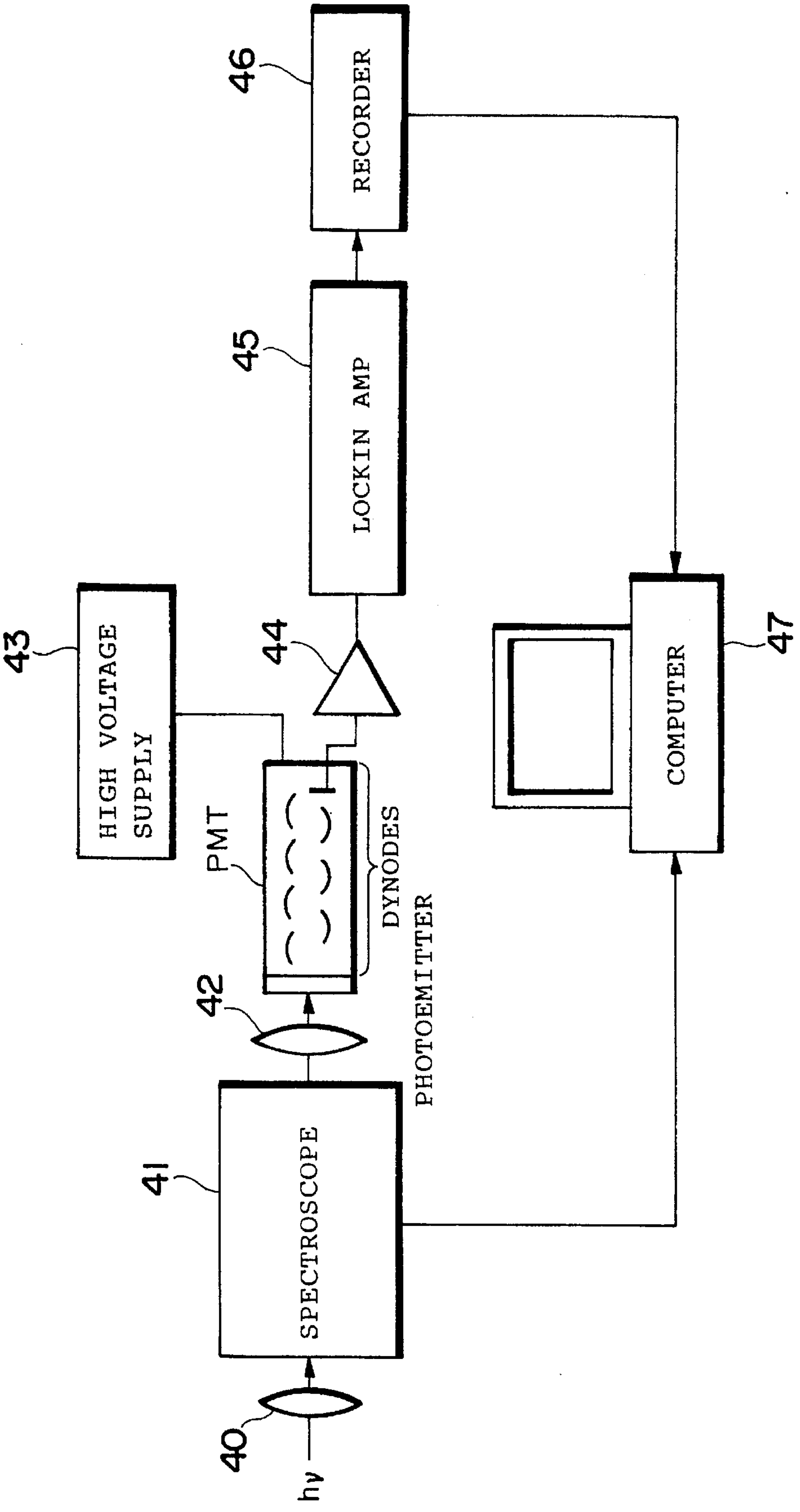
FIG. 18 is a block diagram to show the structure of an embodiment of a photodetecting apparatus according to the present invention.

An embodiment of an image intensifier to which either one of the transmission-type photoemission devices shown in FIG. 4 and FIG. 10 is applied will now be described with reference to FIG. 18. FIG. 16 is a cross section of main part of the image intensifier.

The structure is first described. A photon-entering window 35 is provided at one end of a vacuum vessel 34. In the vacuum vessel 34 the transmission-type photoemission device W shown in FIG. 4 or FIG. 10 is arranged to be opposed to the photon-entering window 35. Further, a microchannel plate (electron multiplier) 36 is arranged to be internally opposed to the emission surface of transmission-type photoemission device W. A fluorescent film 37 is formed on the opposite side of the microchannel plate 36.

The microchannel plate 36 is formed, for example, of a thin glass plate of about 25 mm in diameter and about 0.48 mm in thickness. Further, there are a lot of fine pores (channels), e.g., about a million and some hundred thousand channels, each having an inner diameter of about 10 μm, formed through the microchannel plate 36 along directions toward the reflection-type photoemission device. A potential gradient is set by applying a voltage between two ends of each channel. When an electron enters a channel from the reflection-type photoemission device side, the electron drawn by the potential gradient moves toward the opposite side while hitting the internal wall of the channel many times. The collisions cause electron multiplication, so that electrons are multiplied, for example, $10^6$ times, making the fluorescent film 37 radiate light.

Operation of the image intensifier having the above structure will now be described.

When light A from a subject enters the photoemission device W through the photon-entering window 35, the light A is absorbed in the photoemission device W to excite photoelectrons e, which are emitted into the vacuum. The photoelectrons e are then incident into the microchannel plate 36. As described previously, the photoemission device W has the high quantum efficiency to emit the photoelectrons e into the vacuum. Since the incident photoelectrons e are electron-multiplied in the respective fine pores (channels) and are accelerated by the potential gradient to impinge on the fluorescent film 37, an image of the subject is clearly reproduced on the fluorescent film 37.

The image intensifier of the present invention is so arranged, as described above, that the photoemission device W with high quantum efficiency emits a lot of photoelectrons e from the beginning and the photoelectrons are electron-multiplied, thus enabling the device to attain a high signal to noise ratio and high gain and achieving high-sensitive and clear image pickup even under a lower illuminance than that attainable by conventional devices.

Embodiment 12

Figure 17:
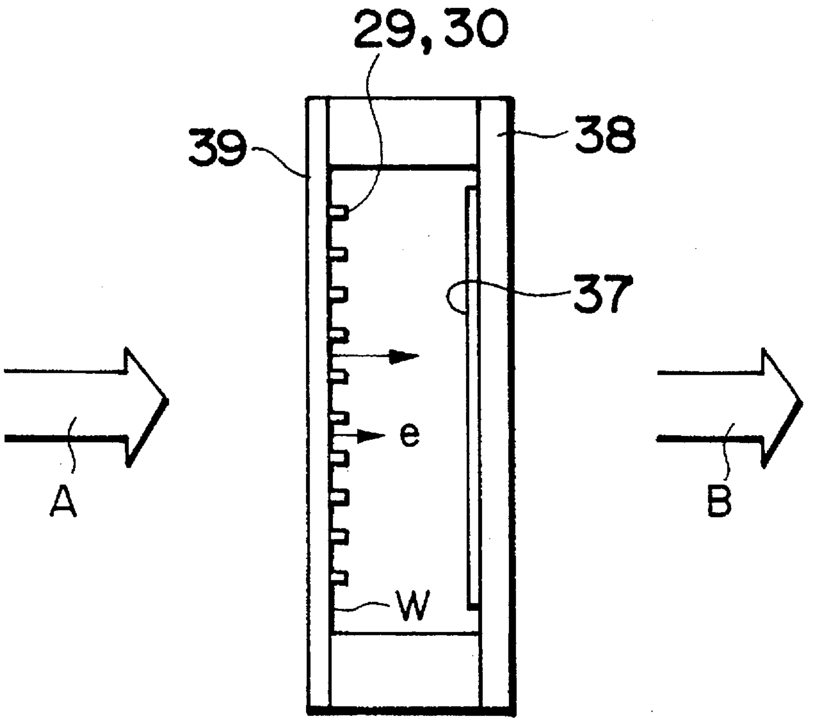
FIG. 17 is a cross section to show the structure of main part of another embodiment of an image intensifier according to the present invention.

Another embodiment of the image intensifier is next described referring to FIG. 17. The present embodiment is a so-called proximity image tube excluding the microchannel plate, different from the embodiment shown in FIG. 16.

The structure is first described. A transparent photon-entering window 39 is provided at one end of a vacuum vessel 38. A transmission-type photoemission device w shown in FIG. 4 or FIG. 10 is fixed to the inner surface of the photon-entering window 39. The insulator layer 29 and converging electrode 30 shown in FIG. 12 are laminated on the lead electrode 11, 27 (FIG. 4 or FIG. 10) of the transmission-type photoemission device W, so that numerous fine regions without the lamination of the insulator layer 29 and converging electrode 30 constitute pixels. A fluorescent film 37 is formed on the opposite side of the transmission-type photoemission device W. As described in detail with the embodiment of FIG. 12, the converging electrode 30 is kept at a predetermined potential and an acceleration voltage is applied between the converging electrode 30 and the fluorescent film 37.

When light A enters the transmission-type photoemission device W through the photon-entering window 39, photoelectrons e are emitted from the back side of the device and then are accelerated by the acceleration voltage to impinge on the fluorescent film 37. The collision of photoelectrons e causes the fluorescent film 37 to radiate, thus reproducing an image B.

Incidentally, a point to be noted in the present embodiment is that because the converging electrode 30 is kept at the predetermined potential, the photoelectrons e emitted from the transmission-type photoemission device W are controlled so as not to spatially spread. Accordingly, the image intensifier of this embodiment can show an extremely high spatial resolution and, therefore, can provide a clear reproduction image B.

Embodiment 13

An embodiment of a high-sensitive photodetecting apparatus, to which either one of the photomultiplier tubes of the present invention, for example one shown in the embodiment of FIG. 16, is applied will now be described with reference to FIG. 18. The present embodiment employs a transmission-type photomultiplier tube PMT provided with the transmission-type photoemission device. In FIG. 18, measured light hν is allowed to pass through a condenser lens 40, a spectroscope 41, and a coupling lens 42 to be spectrum-separated. The optical system is arranged to make the thus spectrum-separated light incident into the photoemission device in the photomultiplier tube PMT. The photoemission device converts the incident light into photoelectrons and emits them toward the dynodes. Photocurrents electron-multiplied by the dynodes are output from an anode of the photomultiplier tube PMT. Predetermined bias voltages are applied through a high voltage supply 43 and a resistance divider (not shown) to the photoemission device, the lead electrode, and the dynodes in the photomultiplier tube PMT.

The photocurrents output from the anode in the photomultiplier tube PMT are amplified and measured by a pre-amplifier 44 and a lockin amplifier 45, and are recorded on a recorder (recording device ) 46. Further, spectroscopic signals output from the spectroscope 41 and level signals output from the recorder 46 are supplied to a computer processing system 47. The computer processing system 47 monitors to indicate a spectrum spread of the measured light hν, based on wavelength information of the spectroscope signals and the intensity information of the level signals.

The present embodiment showed the photodetecting apparatus having the very basic structure, but, utilizing the photomultiplier tube of the present invention, a high-sensitive photodetecting apparatus can be achieved applying another measurement method, for example, a pulse measurement method or a photon counting method Also, a high-sensitive photodetecting apparatus of multichannel photometry can be achieved employing the image intensifier of the present invention.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.218609/1993 filed on Sep. 2, 1993 and No.226237/1993 filed on Sep. 10, 1993 are hereby incorporated by reference.

What is claimed is:

1. A photoemission device comprising:

a photon absorbing layer having either one of a p-type semiconductor, a semi-insulating semiconductor, and a hetero structure and absorbing incident photons to excite photoelectrons;

a Schottky electrode layered on one surface of said photon absorbing layer;

a lead electrode layered through an insulator layer on said Schottky electrode; and contacts formed on respective, appropriate portions of said Schottky electrode and said photon absorbing layer in order to apply a predetermined polarity bias voltage between said photon absorbing layer and said Schottky electrode and a predetermined polarity bias voltage between said Schottky electrode and said lead electrode;

wherein the photoelectrons excited by incident photons entering said photon absorbing layer are made to be emitted by an electric field produced by said predetermined polarity bias voltages.

2. A photoemission device according to claim 1, wherein said Schottky electrode is layered in a predetermined pattern on said photon absorbing layer, said insulator layer and said lead electrode are successively formed in the predetermined pattern on the Schottky electrode, and among said photon absorbing layer a remaining region where said Schottky electrode is not formed is coated with a metal layer comprising either one of an alkali metal, a compound of the alkali metal, an oxide of the alkali metal, and a fluoride of the alkali metal.

3. A photoemission device according to claim 1, wherein a converging electrode is layered through another insulator layer on said lead electrode and a predetermined polarity bias voltage is applied between said converging electrode and said another insulator layer.

4. A photoemission device according to claim 2, wherein a converging electrode is layered through another insulator layer on said lead electrode and a predetermined polarity bias voltage is applied between said converging electrode and said another insulator layer.

5. A photoemission device according to claim 1, wherein said photon absorbing layer has either one of a III–V compound semiconductor, a mixed crystal III–V compound semiconductor, and a hetero structure of III–V compound semiconductors.

6. A photoemission device according to claim 1, wherein said photon absorbing layer is formed of GaAs.

7. A photoemission device according to claim 1, wherein said photon absorbing layer is formed of $GaAs_yP_{(1-y)}$ (where $0 \leqq y \leqq 1$).

8. A photoemission device according to claim 1, wherein said photon absorbing layer is formed of $In_xGa_{(1-x)}As_yP_{(1-y)}$ (where $0 \leqq x \leqq 1$ and $0 \leqq y \leqq 1$).

9. A photoemission device according to claim 1, wherein said photon absorbing layer has a hetero structure of GaAs and $Al_xGa_{(1-x)}As$ (where $0 \leqq x \leqq 1$).

10. A photoemission device according to claim 1, wherein said photon absorbing layer has a hetero structure of GaAs and $In_xGa_{(1-x)}As$ (where $0 \leqq x \leqq 1$).

11. A photoemission device according to claim 1, wherein said photon absorbing layer has a hetero structure of InP and $In_xGa_{(1-x)}As_yP_{(1-y)}$ (where $0 \leqq x \leqq 1$and $0 \leqq y \leqq 1$).

12. A photoemission device according to claim 1, wherein said photon absorbing layer has a hetero structure of InP and $In_xAl_yGa_{[1-(x+y)]}As$ (where $0 \leqq x \leqq 1$ and $0 \leqq y \leqq 1$).

13. A photoemission device according to claim 1, wherein said photon absorbing layer has either one of p-type Si, p-type Ge, a mixed crystal of p-type Si, a mixed crystal of p-type Ge, and hetero structures thereof.

14. A photoemission device according to claim 1, wherein said insulator layer has either one of $SiO_2$, $Si_3N_4$, $Al_2O_3$, and lamination structures thereof.

15. A photoemission device according to claim 2, wherein said alkali metal is either one of Cs, K, Na, and Rb.

16. An electron tube comprising:

the photoemission device as set forth in claim 1 and an electron multiplier for electron-multiplying photoelectrons emitted from said photoemission device.

17. An electron tube according to claim 16, wherein said electron multiplier comprises dynodes.

18. An electron tube according to claim 17, wherein said electron multiplier comprises a microchannel plate.

19. An electron tube comprising:

the photoemission device as set forth in claim 2; and an electron multiplier for electron-multiplying photoelectrons emitted from said photoemission device.

20. An electron tube according to claim 19, wherein said electron multiplier comprises dynodes.

21. An electron tube according to claim 19, wherein said electron multiplier comprises a microchannel plate.

22. An electron tube comprising:

the photoemission device as set forth in claim 3; and an electron multiplier for electron-multiplying photoelectrons emitted from said photoemission device.

23. An electron tube according to claim 22, wherein said electron multiplier comprises dynodes.

24. An electron tube according to claim 22, wherein said electron multiplier comprises a microchannel plate.

25. An electron tube comprising:

the photoemission device as set forth in claim 4; and an electron multiplier for electron-multiplying photoelectrons emitted from said photoemission device.

26. An electron tube according to claim 25, wherein said electron multiplier comprises dynodes.

27. An electron tube according to claim 25, wherein said electron multiplier comprises a microchannel plate.

28. A photodetecting apparatus comprising:

the electron tube as set forth in claim 17; and signal processing means for signal-processing an output from said electron tube.

29. A photodetecting apparatus comprising:

the electron tube as set forth in claim 20; and signal processing means for signal-processing an output from said electron tube.

30. A photodetecting apparatus comprising:

the electron tube as set forth in claim 23; and signal processing means for signal-processing an output from said electron tube.

31. A photodetecting apparatus comprising:

the electron tube as set forth in claim 25; and signal processing means for signal-processing an output from said electron tube.

* * * * *